United States Patent
Toda

(10) Patent No.: US 6,522,047 B1
(45) Date of Patent: Feb. 18, 2003

(54) ULTRASONIC SIGNAL PROCESSOR OPERATED AT MULTIPLE FREQUENCIES

(76) Inventor: Kohji Toda, 1-49-18 Futaba, Yokosuka (JP), 239-0814

( * ) Notice: Subject to any disclaimer, the term of this patent is extended or adjusted under 35 U.S.C. 154(b) by 28 days.

(21) Appl. No.: 09/916,741

(22) Filed: Jul. 26, 2001

(51) Int. Cl.$^7$ .............................................. H01L 41/08
(52) U.S. Cl. .............................. 310/313 B; 310/313 R; 310/313 D
(58) Field of Search ....................... 310/313 R, 313 B, 310/313 C, 313 D

(56) References Cited

U.S. PATENT DOCUMENTS

| | | | | |
|---|---|---|---|---|
| 5,767,608 A | * | 6/1998 | Toda | 310/313 R |
| 5,798,597 A | * | 8/1998 | Toda | 310/313 R |
| 5,838,088 A | * | 11/1998 | Toda | 310/313 R |
| 5,850,118 A | * | 12/1998 | Toda | 310/313 R |
| 5,973,438 A | * | 10/1999 | Toda | 310/313 B |
| 6,060,812 A | * | 5/2000 | Toda | 310/313 R |

* cited by examiner

Primary Examiner—Mark O. Budd

(57) ABSTRACT

An ultrasonic processor operated at multiple frequencies comprises a nonpiezoelectric plate, an input IDT, an output IDT, a first piezoelectric substrate, and a second piezoelectric substrate. The input IDT with a dispersive type of electrode-finger pattern has an overlap length L and interdigital periodicities $P_i$ ($i=1, 2, \ldots, m$). The output IDT with a dispersive-slant type of electrode-finger pattern has the electrode-finger direction slanting to that of the input IDT by an angle $\theta$, and also has an overlap length $L_P$ along the electrode-finger direction of the output IDT and interdigital periodicities $Q_i$ ($i=1, 2, \ldots, m$) along the orthogonal direction to the electrode-finger direction of the output IDT. The input- and output IDTs, and the first- and second piezoelectric substrates form a transducer-unit. If one of input electric signals $S_i$ ($i=1, 2, \ldots, m$) with frequencies $f_i$ ($i=1, 2, \ldots, m$) corresponding to the interdigital periodicities $P_i$, respectively, is applied to the input IDT, a SAW is excited in the first piezoelectric substrate. The SAW is transmitted to the second piezoelectric substrate along an upper end surface of the nonpiezoelectric plate. And then, the SAW is transduced at the output IDT to electric signals $E_j$ ($j=1, 2, \ldots, n$), of which the phase delays linearly correlate to SAW propagation lanes $W_j$ ($j=1, 2, \ldots, n$) between the input- and output IDTs on the upper end surface of the nonpiezoelectric plate.

17 Claims, 9 Drawing Sheets

ULTRASONIC SIGNAL PROCESSOR OPERATED AT MULTIPLE FREQUENCIES

BACKGROUND OF THE INVENTION

1. Field of the Invention

The present invention relates to an ultrasonic signal processor operated at multiple frequencies by means of using an input interdigital transducer (IDT) with a dispersive type of electrode-finger pattern and an output IDT with a dispersive-slant type of electrode-finger pattern.

2. Description of the Prior Art

Conventional ultrasonic transducers for signal processing such as a wedge-shaped transducer and a piezoelectric thin film transducer make use of disappearing of an output electric signal, which disappears in response to a disappearance of an ultrasound on a panel plate by touching thereon. In addition, it is difficult for conventional ultrasonic transducers to be operated under multiple frequencies. Disappearing of the output electric signal makes signal analysis complicated, and makes it difficult for the conventional ultrasonic transducers to be of use as hardware for the coding technique, when assembled in personal computer (PC) such as wearable PC, desktop- and laptop PCs, and notebook PC.

Conventional hardware such as magnetic cards and IC cards make it difficult to keep the information secret. The magnetic cards are very convenient and popular, however it is easy to make copies thereof or steal passwords. The IC cards are superior to the magnetic cards in difficulty in counterfeiting of cards, however it is not enough to keep the information secret thoroughly. In order to keep the information through PC secret, and to prevent the influence of noises and invaders, and then to keep a communication secret, it is necessary to construct a security system for PC.

SUMMARY OF THE INVENTION

An object of the present invention is to provide an ultrasonic signal processor operated at multiple frequencies capable of transmitting an ultrasound on a nonpiezoelectric plate.

Another object of the present invention is to provide an ultrasonic signal processor operated at multiple frequencies capable of sensing a touch position on the nonpiezoelectric plate from an appearance of an electric signal, which appears in response to the disappearance of the ultrasound on the nonpiezoelectric plate by touching thereon.

Another object of the present invention is to provide an ultrasonic signal processor operated at multiple frequencies capable of accurate sensing of a minute touch position on the nonpiezoelectric plate with a high sensitivity, high resolution, and a quick response time.

Another object of the present invention is to provide an ultrasonic signal processor operated at multiple frequencies making a contribution to the coding technique.

Another object of the present invention is to provide an ultrasonic signal processor operated at multiple frequencies preventing the influence of noises and invaders.

Another object of the present invention is to provide an ultrasonic signal processor operated at multiple frequencies making it difficult to steal information.

Another object of the present invention is to provide an ultrasonic signal processor operated at multiple frequencies keeping a communication secret.

Another object of the present invention is to provide an ultrasonic signal processor operated at multiple frequencies excellent in manufacturing and mass production.

Another object of the present invention is to provide an ultrasonic signal processor operated at multiple frequencies capable of operation under low electric power consumption with low voltage.

A still other object of the present invention is to provide an ultrasonic signal processor operated at multiple frequencies having a small-sized circuit with a simple structure which is very light in weight.

According to one aspect of the present invention there is provided an ultrasonic signal processor operated at multiple frequencies comprising a nonpiezoelectric plate, an input IDT, an output IDT, a first piezoelectric substrate, and a second piezoelectric substrate. The input IDT with a dispersive type of electrode-finger pattern has an overlap length L and interdigital periodicities $P_i$ (i=1, 2, ..., m). The output IDT with a dispersive-slant type of electrode-finger pattern has the electrode-finger direction slanting to that of the input IDT by an angle θ, and also has an overlap length $L_P$ along the electrode-finger direction of the output IDT and interdigital periodicities $Q_i$ (i=1, 2, ..., m) along the orthogonal direction to the electrode-finger direction of the output IDT. The input- and output IDTs, and the first- and second piezoelectric substrates form a transducer-unit.

If one of input electric signals $S_i$ (i=1, 2, ..., m) with frequencies $f_i$ (i=1, 2, ..., m) corresponding to the interdigital periodicities $P_i$, respectively, is applied to the input IDT, a SAW is excited in the first piezoelectric substrate. The SAW is transmitted to the second piezoelectric substrate along an upper end surface of the nonpiezoelectric plate. And then, the SAW is transduced at the output IDT to electric signals $E_j$ (j=1, 2, ..., n), of which the phase delays linearly correlate to SAW propagation lanes $W_j$ (j=1, 2, ..., n) between the input- and output IDTs on the upper end surface of the nonpiezoelectric plate.

According to another aspect of the present invention there is provided an output IDT having the interdigital periodicities $Q_i$ and the overlap length $L_P$. Each of the interdigital periodicities $Q_i$ is equal to the product of the corresponding one of the interdigital periodicities $P_i$ and cos θ. The overlap length $L_P$ is equal to the product of the overlap length L and sec θ.

According to another aspect of the present invention there is provided an ultrasonic signal processor operated at multiple frequencies further comprising a third piezoelectric substrate, a coding IDT, a terminal IDT having the electrode-finger direction parallel to that of the coding IDT, a fourth piezoelectric substrate, an initial IDT, a decoding IDT, and a signal analyzer. The coding IDT consists of electrode-finger pairs, of which two neighbors are at a distance from each other, and has a coded pattern. The distance equals one of the interdigital periodicities $P_i$. The decoding IDT has the same construction pattern as the coding IDT. In the ultrasonic signal processor operated at multiple frequencies, if touching one of the SAW propagation lanes $W_j$, one of the electric signals $E_j$ is detected at the output IDT, and then, it arrives at the coding IDT. In this time, a SAW based on the coded pattern is excited on the third piezoelectric substrate. The SAW based on the coded pattern is detected as a coded burst-signal at the terminal IDT. The coded burst signal arrives at the initial IDT, so that a SAW is excited on the fourth piezoelectric substrate. In this time, if the SAW on the fourth piezoelectric substrate correlates to the coded pattern, a pulse is detected at the decoding IDT. The pulse arrives at the signal analyzer. As a result, the touch position, that is, the one of the SAW propagation lanes $W_j$ is sensed by means of the phase of the pulse.

According to another aspect of the present invention there are provided first- and second piezoelectric substrates made of a piezoelectric ceramic, respectively, the polarization axis thereof being parallel to the thickness direction thereof.

According to another aspect of the present invention there are provided first- and second piezoelectric substrates having a thickness smaller than the smallest one of the interdigital periodicities $P_i$, and a nonpiezoelectric plate having a thickness larger than three times the largest one of the interdigital periodicities $P_i$.

According to another aspect of the present invention there is provided an ultrasonic signal processor operated at multiple frequencies, wherein the phase velocity of the SAW on the nonpiezoelectric plate alone is higher than that in the first- and second piezoelectric substrates alone.

According to other aspect of the present invention there is provided an ultrasonic signal processor operated at multiple frequencies comprising the nonpiezoelectric plate and two transducer-units, of which each consists of at least one input IDT, at least one output IDT, the first piezoelectric substrate, and the second piezoelectric substrate. If one of the input electric signals $S_i$ is applied to the input IDT, a SAW is excited in the first piezoelectric substrate. The SAW is transmitted to the second piezoelectric substrate along the upper end surface of the nonpiezoelectric plate, and then it is transduced to the electric signals $E_j$ at the output IDT.

According to a further aspect of the present invention there is provided an ultrasonic signal processor operated at multiple frequencies comprising the nonpiezoelectric plate, two ultrasonic units, the third piezoelectric substrate, the fourth piezoelectric substrate, and the signal analyzer. Each of the ultrasonic units consists of the input IDT, the output IDT, the first piezoelectric substrate, the second piezoelectric substrate, the coding IDT, the terminal IDT, the initial IDT, and the decoding IDT.

BRIEF DESCRIPTION OF THE DRAWINGS

Other features and advantages of the invention will be clarified from the following description with reference to the attached drawings.

DETAILED DESCRIPTION OF THE PRESENTLY PREFERRED EXEMPLARY EMBODIMENTS

Figure 1:
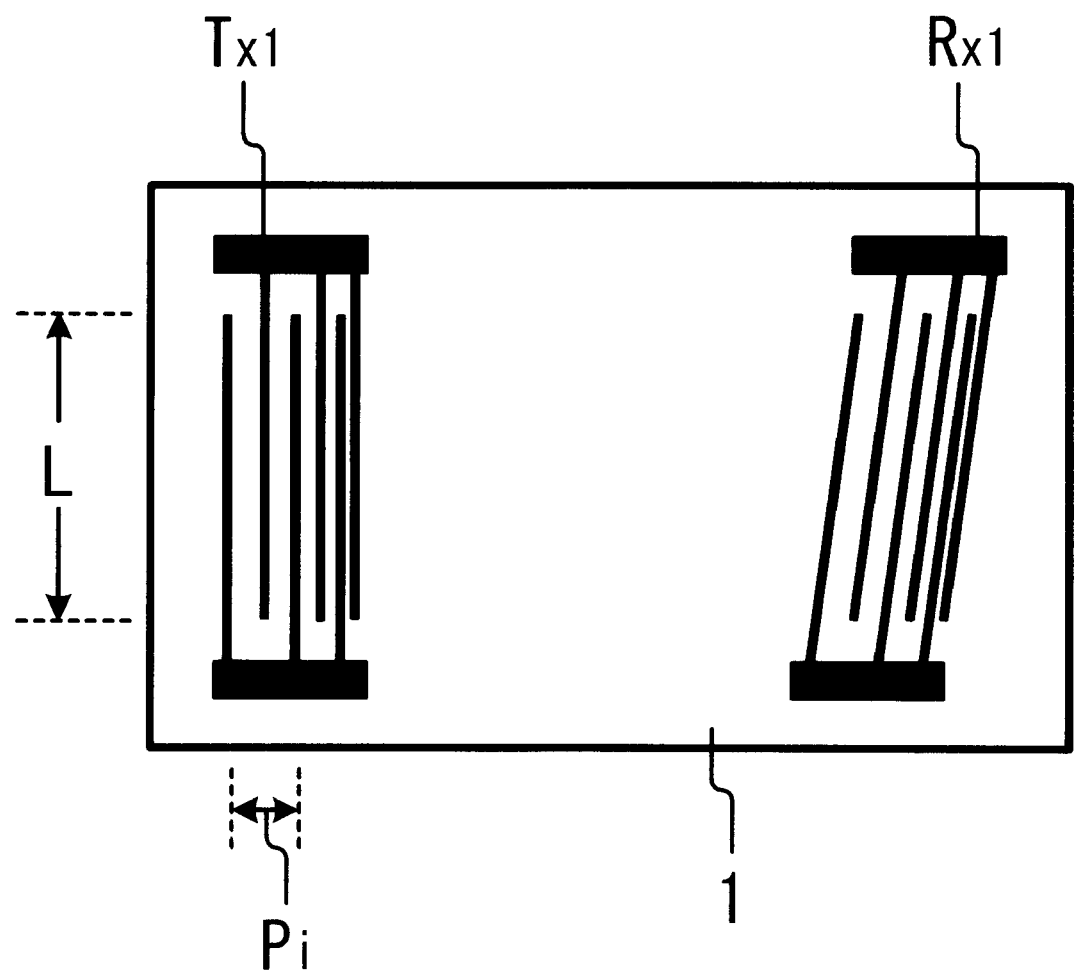
FIG. 1 shows a schematic illustration of an ultrasonic signal processor operated at multiple frequencies according to a first embodiment of the present invention.

FIG. 1 shows a schematic illustration of an ultrasonic signal processor operated at multiple frequencies according to a first embodiment of the present invention. The ultrasonic signal processor operated at multiple frequencies comprises nonpiezoelectric plate 1, first piezoelectric substrate 2, second piezoelectric substrate 3, input IDT $T_{x1}$, and output IDT $R_{x1}$. Nonpiezoelectric plate 1 is made of a glass plate. Input IDT $T_{x1}$ has a dispersive type of electrode-finger pattern, and has an overlap length L (12 mm), and interdigital periodicities $P_i$ (i=1, 2, ..., m) of 400~500 μm, that is, from $P_1$ of 400 μm to $P_m$ of 500 μm. Input IDT $T_{x1}$ and output IDT $R_{x1}$, made of an aluminum thin film, respectively, are formed on nonpiezoelectric plate 1. First piezoelectric substrate 2 and second piezoelectric substrate 3 are not drawn in FIG. 1. Input IDT $T_{x1}$, output IDT $R_{x1}$, first piezoelectric substrate 2, and second piezoelectric substrate 3 form a transducer-unit.

Figure 2:
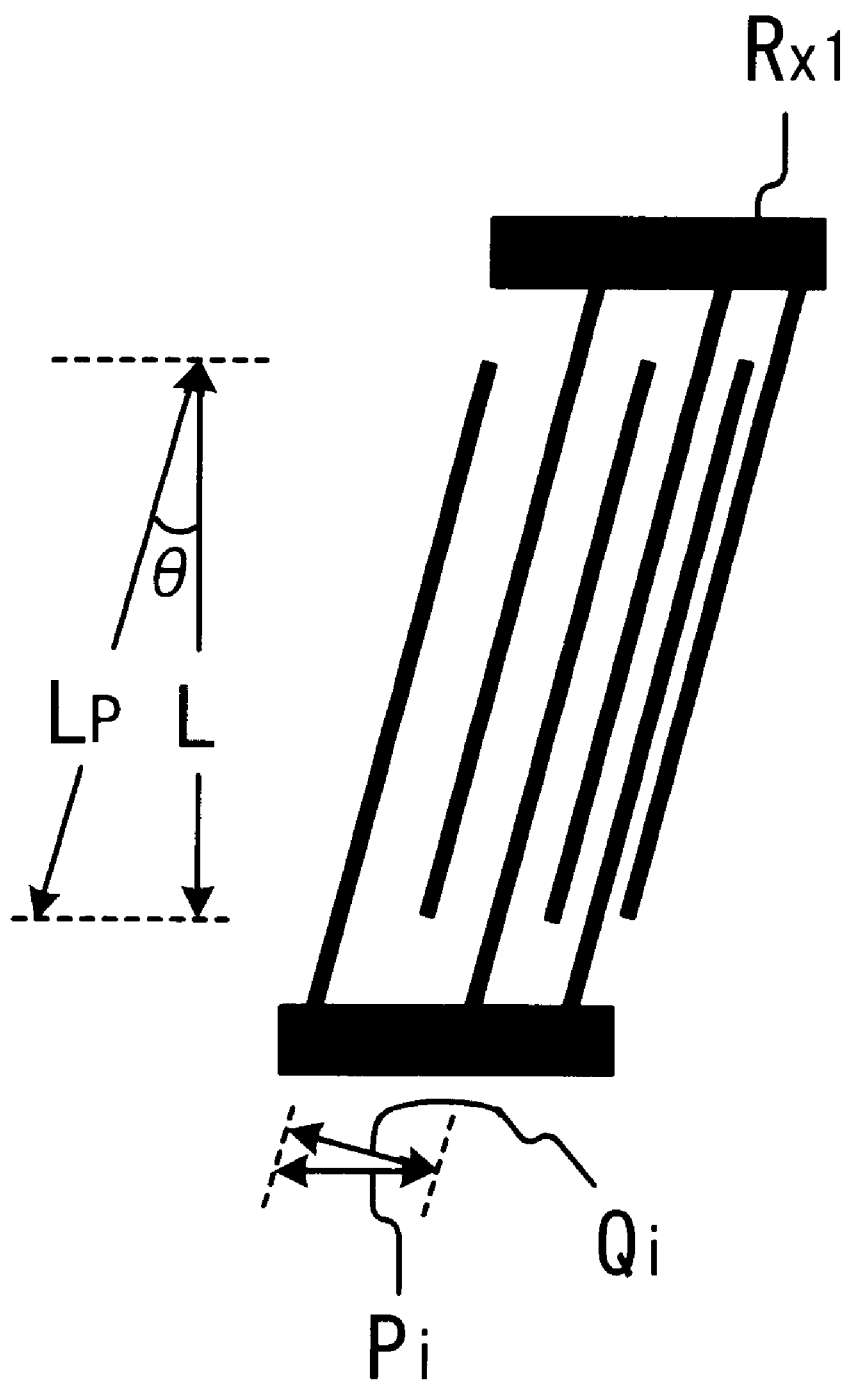
FIG. 2 shows a plan view of output IDT $R_{x1}$ with a dispersive-slant type of electrode-finger pattern.

FIG. 2 shows a plan view of output IDT $R_{x1}$ with a dispersive-slant type of electrode-finger pattern. Output IDT $R_{x1}$ is located such that the electrode-finger direction thereof is slanting to that of input IDT $T_{x1}$ by an angle θ. And then, output IDT $R_{x1}$ has an overlap length $L_P$ along the electrode-finger direction thereof, and interdigital periodicities $Q_i$ (i=1, 2, ..., m) along the orthogonal direction to the electrode-finger direction thereof. Each of the interdigital periodicities $Q_i$ is equal to the product of the corresponding one of the interdigital periodicities $P_i$ and cos θ, and the overlap length $L_P$ is equal to the product of the overlap length L and sec θ.

Figure 3:
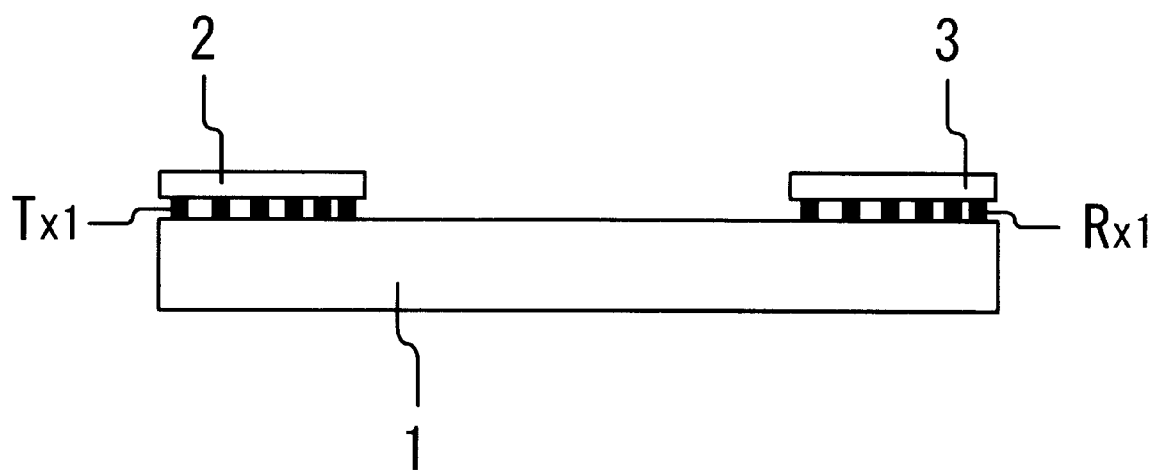
FIG. 3 shows a sectional view of the ultrasonic signal processor operated at multiple frequencies in FIG. 1.

FIG. 3 shows a sectional view of the ultrasonic signal processor operated at multiple frequencies in FIG. 1. Nonpiezoelectric plate 1 has a dimension of 1.5 mm in thickness. First piezoelectric substrate 2 and second piezoelectric substrate 3 are made of a piezoelectric ceramic thin plate with a dimension of 150 μm in thickness, respectively, and the polarization axis thereof is parallel to the thickness direction thereof. First piezoelectric substrate 2 and second piezoelectric substrate 3 are mounted on input IDT $T_{x1}$ and output IDT $R_{x1}$, respectively.

In the ultrasonic signal processor operated at multiple frequencies in FIG. 1, if one of input electric signals $S_i$ (i=1, 2, ..., m) with frequencies $f_i$ (i=1, 2, ..., m) corresponding to the interdigital periodicities $P_i$, respectively, is applied to input IDT $T_{x1}$, a SAW is excited in first piezoelectric substrate 2. In this time, because first piezoelectric substrate 2 is made of a piezoelectric ceramic, and the polarization axis thereof is parallel to the thickness direction thereof, the SAW is effectively excited in first piezoelectric substrate 2. In addition, if the phase velocity of the SAW is approximately the same as that of the Rayleigh wave traveling on nonpiezoelectric plate 1 alone, the one of the input electric signals $S_i$ is effectively transduced to the SAW. Furthermore, the dispersion of electrode-finger pattern of input IDT $T_{x1}$ enables the operation at multiple frequencies.

The SAW excited in first piezoelectric substrate 2 is effectively transmitted to second piezoelectric substrate 3, along the upper end surface of nonpiezoelectric plate 1 without a leakage of the SAW into the inside of nonpiezoelectric plate 1, because (1) the thickness of first piezoelectric substrates 2 is smaller than the smallest one of the interdigital periodicities $P_i$, (2) the thickness of nonpiezoelectric plate 1 is larger than three times the largest one of the interdigital periodicities $P_i$, and (3) nonpiezoelectric plate 1 is made of the glass, in which the phase velocity of the SAW traveling on nonpiezoelectric plate 1 alone is higher than that traveling on first piezoelectric substrate 2 alone.

The SAW transmitted to second piezoelectric substrate 3 is transduced to electric signals $E_{xj}$ (j=1, 2, . . . , n) at output IDT $R_{x1}$. Thus, SAW propagation lanes $W_{xj}$ (j=1, 2, . . . , n) on the upper end surface of nonpiezoelectric plate 1 are formed between input IDT $T_{x1}$ and output IDT $R_{x1}$. If touching a position on one of the SAW propagation lanes $W_{xj}$, one of the electric signals $E_{xj}$ is detected at output IDT $R_{x1}$. In other words, if touching nowhere, no electric signal is detected at output IDT $R_{x1}$, because the sum of the phases of the electric signals $E_{xj}$ which linearly correlate to the SAW propagation lanes $W_{xj}$ is zero as the result of phase compensation.

Figure 4:
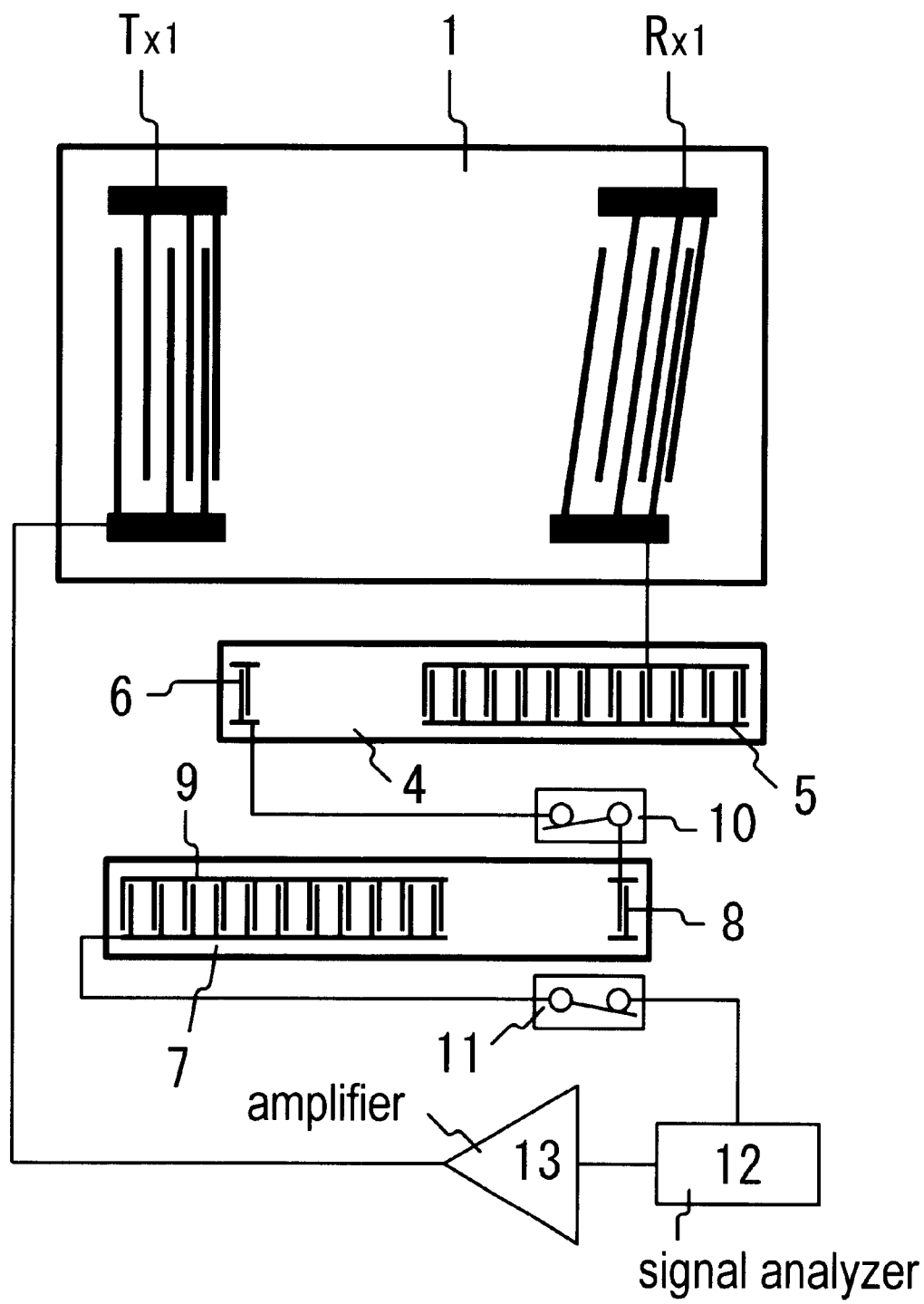
FIG. 4 shows a schematic illustration of an ultrasonic signal processor operated at multiple frequencies according to a second embodiment of the present invention.

FIG. 4 shows a schematic illustration of an ultrasonic signal processor operated at multiple frequencies according to a second embodiment of the present invention. The ultrasonic signal processor operated at multiple frequencies has the same construction as FIG. 1, except for the presence of third piezoelectric substrate 4, coding IDT 5, terminal IDT 6, fourth piezoelectric substrate 7, initial IDT 8, decoding IDT 9, switches (10 and 11), signal analyzer 12 and amplifier 13. A section made from coding IDT 5, terminal IDT 6, and third piezoelectric substrate 4, on which coding IDT 5 and terminal IDT 6 are mounted, acts as a lock. Another section made from initial IDT 8, decoding IDT 9, and fourth piezoelectric substrate 7, on which initial IDT 8 and decoding IDT 9 are mounted, acts as a key removable through switches (10 and 11). Coding IDT 5, terminal IDT 6, initial IDT 8 and decoding IDT 9 are made of an aluminum thin film, respectively. First piezoelectric substrate 2 and second piezoelectric substrate 3 are not drawn in FIG. 4.

Figure 5:
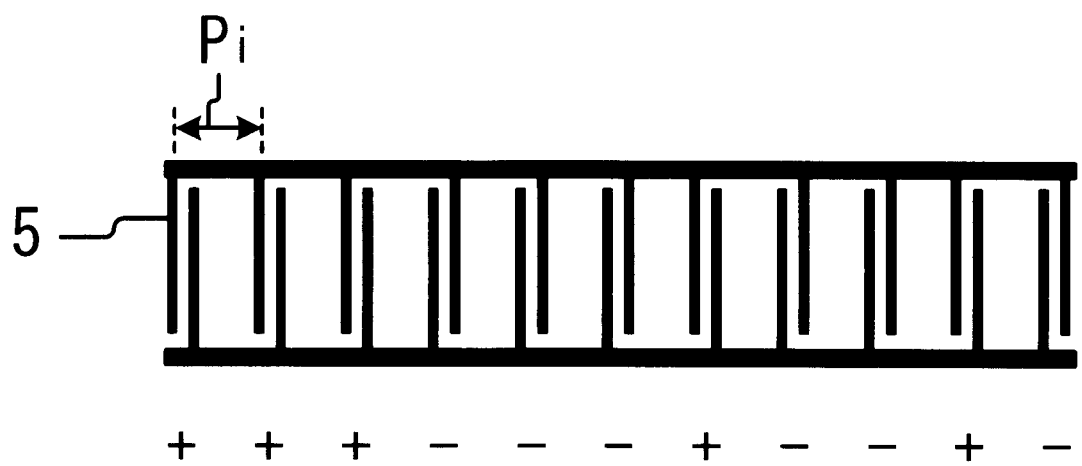
FIG. 5 shows a plan view of coding IDT 5 consisting of eleven electrode-finger pairs.

FIG. 5 shows a plan view of coding IDT 5 consisting of eleven electrode-finger pairs. Two neighbors of the electrode-finger pairs are at a distance from each other. The distance equals one of the interdigital periodicities $P_i$ (400~500 $\mu$m). Coding IDT 5 has a coded pattern based on the Baker code. Besides an eleven-digits code (1, 1, 1, 0, 0, 0, 1, 0, 0, 1, 0) as shown in FIG. 5, for example, a three-digits code (1, 1, 0), a seven-digits code (1, 1, 1, 0, 0, 1, 0), and others are available. Decoding IDT 9 has the same construction pattern as coding IDT 5, and has the same distance, between two neighbors of the electrode-finger pairs, as coding IDT 5.

In the ultrasonic signal processor operated at multiple frequencies in FIG. 4, if one of the input electric signals $S_i$, for example, the input electric signal $S_3$ with the frequency $f_3$ corresponding to the interdigital periodicity $P_3$ is applied to input IDT $T_{x1}$, a SAW is excited in first piezoelectric substrate 2. The SAW is effectively transmitted to second piezoelectric substrate 3, along the upper end surface of nonpiezoelectric plate 1, and transduced to the electric signals $E_{xj}$ at output IDT $R_{x1}$. Thus, the SAW propagation lanes $W_{xj}$ on the upper end surface of nonpiezoelectric plate 1 are formed between input IDT $T_{x1}$ and output IDT $R_{x1}$.

If touching a position on one of the SAW propagation lanes $W_{xj}$, one of the electric signals $E_{xj}$ is detected at output IDT $R_{x1}$. The one of the electric signals $E_{xj}$ is applied to coding IDT 5. In this time, if coding IDT 5 has the distance, equaling the interdigital periodicity $P_3$, between two neighbors of the electrode-finger pairs, a SAW based on the coded pattern is excited on third piezoelectric substrate 4, and then it is detected as a coded burst-signal at terminal IDT 6. The coded burst signal arrives at initial IDT 8 via switch 10, so that a SAW is excited on fourth piezoelectric substrate 7. In this time, if the SAW on fourth piezoelectric substrate 7 correlates to the coded pattern, a pulse is detected at decoding IDT 9. In other words, no key or a key with a decoding IDT having the different construction pattern and the different distance, between two neighbors of the electrode-finger pairs, from decoding IDT 9 causes no pulse, so that it is impossible to operate the PC having the ultrasonic signal processor operated at multiple frequencies of the present invention. Thus, setting the ultrasonic signal processor operated at multiple frequencies in the PC prevents the influence of noises and invaders, because of the coding technique as shown in FIG. 5. Moreover, setting the ultrasonic signal processor operated at multiple frequencies in the PC makes it difficult to steal information, and keeps a communication secret. Furthermore, using coding techniques based on software together with the coding technique as mentioned above brings a further security.

The pulse detected at decoding IDT 9 arrives at signal analyzer 12 via switch 11. As a result, the touch position on the one of the SAW propagation lanes $W_{xj}$ is sensed by means of the phase of the pulse. In addition, supplying input IDT $T_{x1}$ with the pulse via amplifier 13 causes a self-oscillation. Furthermore, sensing the touch position by means of the phase of the pulse makes the signal analysis easy, and causes the circuit construction simplified.

Figure 6:
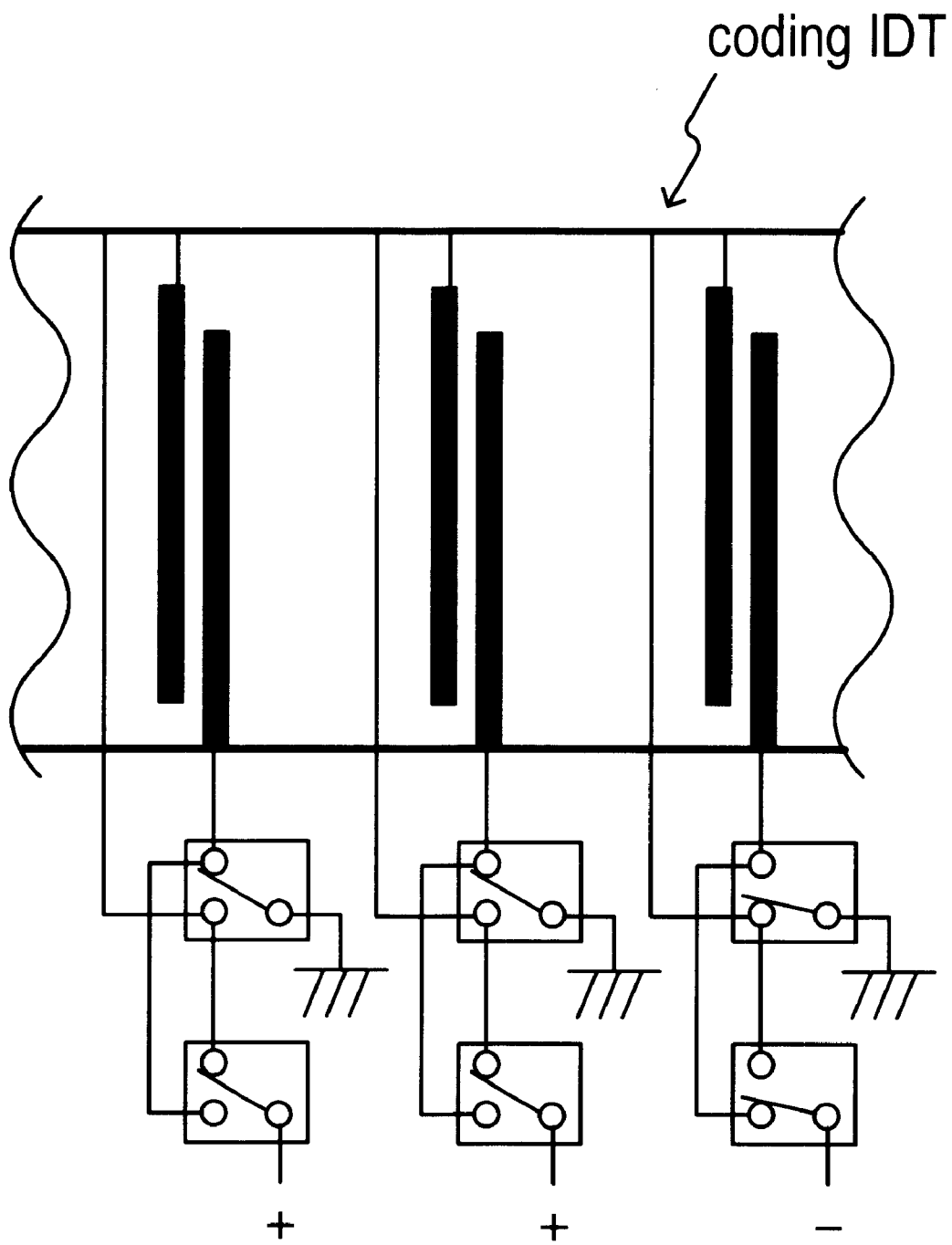
FIG. 6 shows a fragmentary plan view, on an enlarged scale, of a coding IDT used in place of coding IDT 5 and decoding IDT 9.

FIG. 6 shows a fragmentary plan view, on an enlarged scale, of a coding IDT used in place of coding IDT 5 and decoding IDT 9. Changing the polarity of each electrode-finger pair presents a favorite coded pattern. Thus, using the coding IDT in FIG. 6 presents a higher security for the PC having the ultrasonic signal processor operated at multiple frequencies in FIG. 4.

Figure 7:
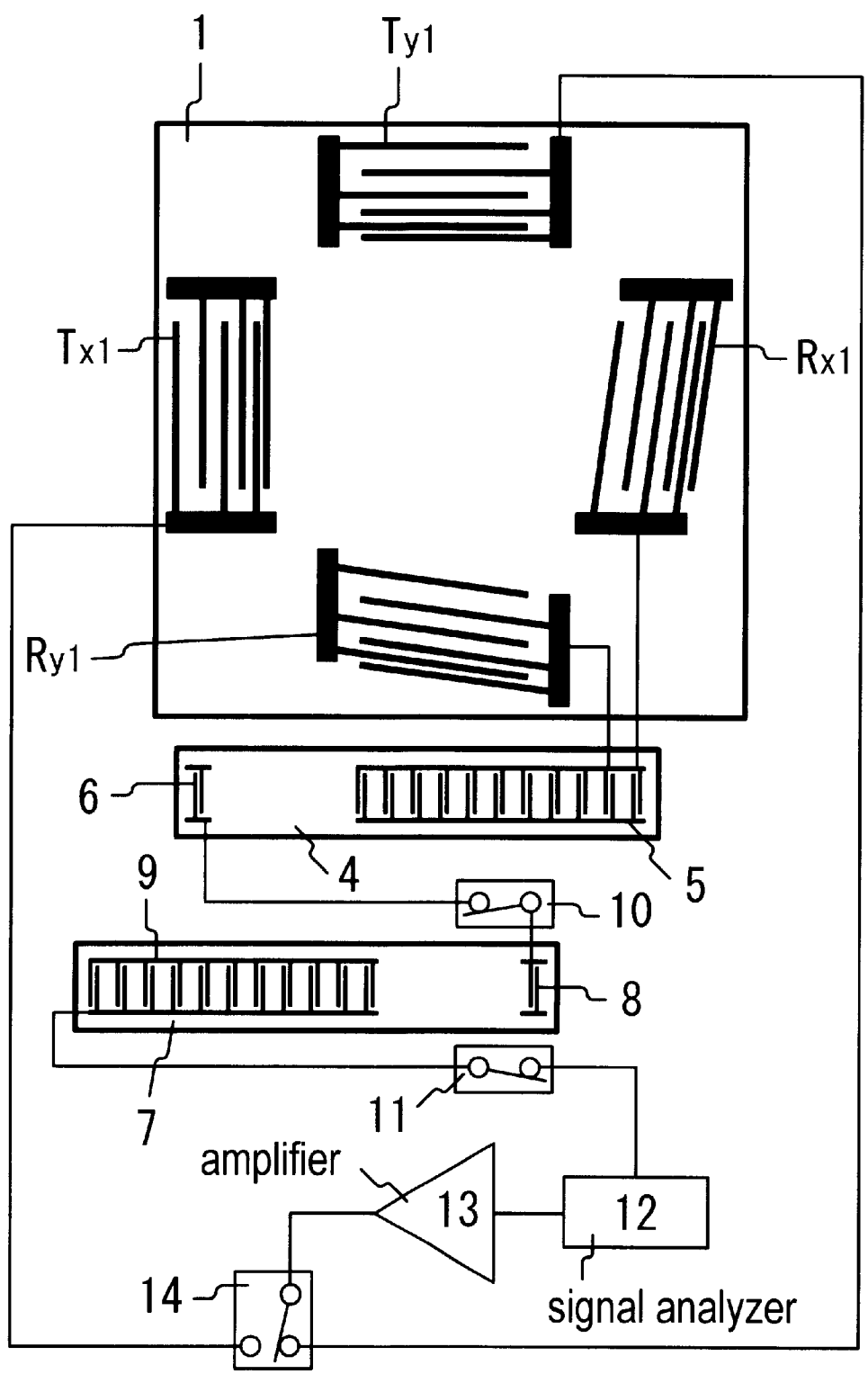
FIG. 7 shows a schematic illustration of an ultrasonic signal processor operated at multiple frequencies according to a third embodiment of the present invention.

FIG. 7 shows a schematic illustration of an ultrasonic signal processor operated at multiple frequencies according to a third embodiment of the present invention. The ultrasonic signal processor operated at multiple frequencies has the same construction as FIG. 4, except for the presence of piezoelectric substrates ($2_x$, $3_x$, $2_y$ and $3_y$), switch 14, input IDT $T_{y1}$, and output IDT $R_{y1}$, and the absence of first piezoelectric substrate 2 and second piezoelectric substrate 3. Input IDT $T_{y1}$ and output IDT $R_{y1}$ have the same constructions as input IDT $T_{x1}$ and output IDT $R_{x1}$, respectively, and are formed on nonpiezoelectric plate 1. Piezoelectric substrates ($2_x$, $3_x$, $2_y$ and $3_y$) with the same constructions as first piezoelectric substrate 2 are mounted on input IDT $T_{x1}$, output IDT $R_{x1}$, input IDT $T_{y1}$, and output IDT $R_{y1}$, respectively, in the same way as FIG. 3, and are not drawn in FIG. 7.

In the ultrasonic signal processor operated at multiple frequencies in FIG. 7, if one of the input electric signals $S_i$ is applied to input IDT ($T_{x1}$ or $T_{y1}$) via switch 14, a SAW is excited in piezoelectric substrate ($2_x$ or $2_y$), respectively. The SAW is effectively transmitted to piezoelectric substrate ($3_x$ or $3_y$), and transduced to the electric signals $E_{xj}$ at output IDT $R_{x1}$, or to electric signals $E_{yj}$ (j=1, 2, . . . , n) at output IDT $R_{y1}$. Thus, the SAW propagation lanes $W_{xj}$ between input IDT $T_{x1}$ and output IDT $R_{x1}$, or SAW propagation lanes $W_{yj}$ (j=1, 2, . . . , n) between input IDT $T_{y1}$ and output IDT $R_{y1}$ are formed on the upper end surface of nonpiezoelectric plate 1.

If touching a position which is not only on one of the SAW propagation lanes $W_{xj}$ but also on one of the SAW propagation lanes $W_{yj}$, one of the electric signals $E_{xj}$ or one of the electric signals $E_{yj}$ is detected at output IDT ($R_{x1}$ or $R_{y1}$), respectively. In other words, if touching nowhere, no electric signal is detected at output IDTs ($R_{x1}$ and $R_{y1}$), because the sum of the phases of the electric signals $E_{xj}$ which linearly correlate to the SAW propagation lanes $W_{xj}$ and that of the electric signals $E_{yj}$ which linearly correlate to the SAW propagation lanes $W_{yj}$ are both zero as the result of phase compensation. The one of the electric signals $E_{xj}$ or the one of the electric signals $E_{yj}$ is applied to coding IDT 5, so that a SAW based on the coded pattern is excited on third piezoelectric substrate 4, and then it is detected as a coded burst-signal at terminal IDT 6. The coded burst signal arrives at initial IDT 8 via switch 10, so that a SAW is excited on fourth piezoelectric substrate 7. In this time, if the SAW on fourth piezoelectric substrate 7 correlates to the coded pattern, a pulse is detected at decoding IDT 9. The pulse arrives at signal analyzer 12 via switch 11. As a result, the one of the SAW propagation lanes $W_{xj}$ or the one of the SAW propagation lanes $W_{yj}$ is sensed by means of the phase of the pulse. In this time, it should be noticed that which of input IDTs ($T_{x1}$ and $T_{y1}$) receives the one of the input electric signals $S_i$ when the pulse appears at signal analyzer 12. If input IDT $T_{x1}$ receives the one of the input electric signals $S_i$, the one of the SAW propagation lanes $W_{xj}$ is defined, and if input IDT $T_{y1}$ receives the one of the input electric signals $S_i$, the one of the SAW propagation lanes $W_{yj}$ is defined. Thus, the touch position on the one of the SAW propagation lanes $W_{xj}$ and on the one of the SAW propagation lanes $W_{yj}$ is recognized.

Figure 8:
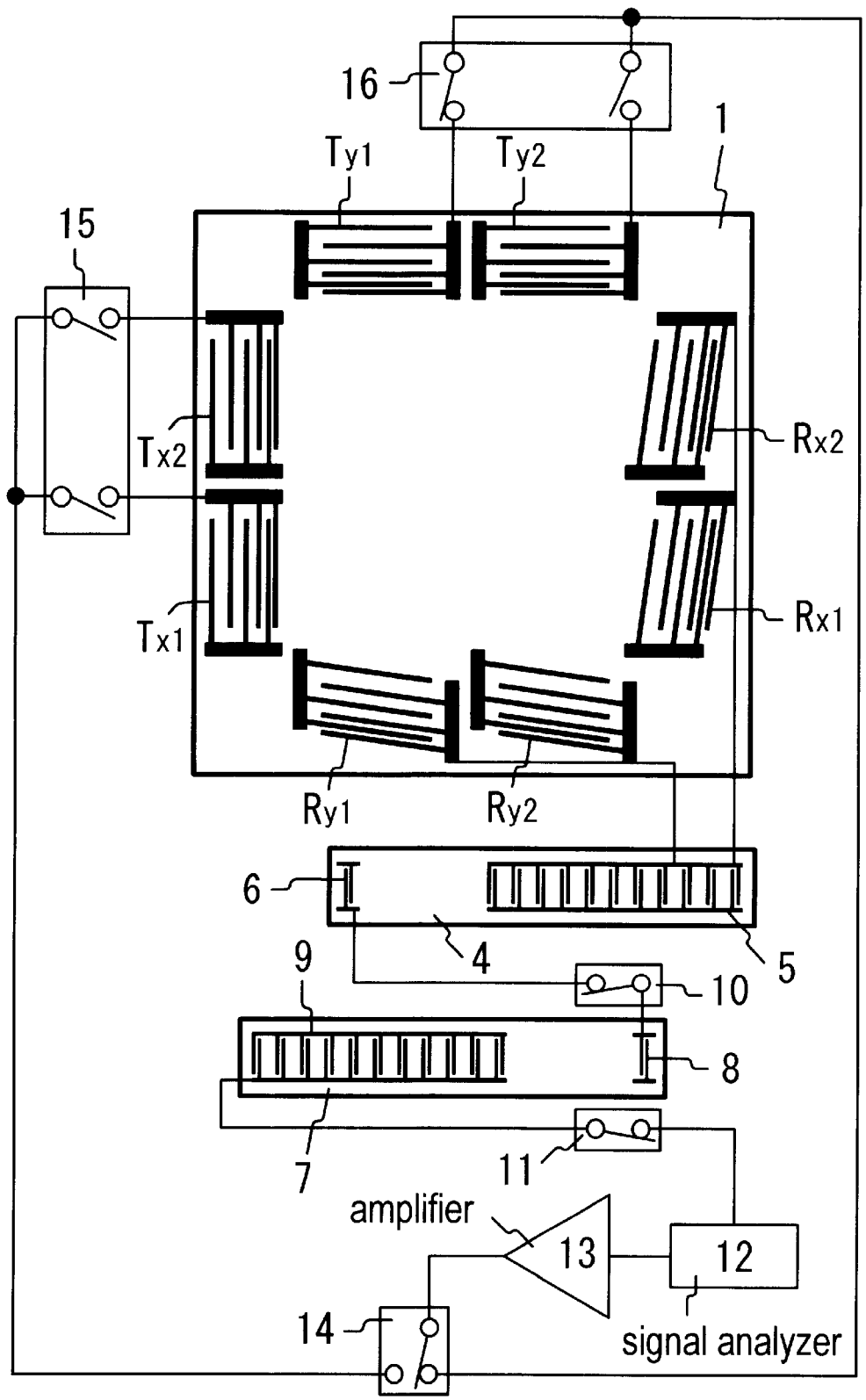
FIG. 8 shows a schematic illustration of an ultrasonic signal processor operated at multiple frequencies according to a fourth embodiment of the present invention.

FIG. 8 shows a schematic illustration of an ultrasonic signal processor operated at multiple frequencies according to a fourth embodiment of the present invention. The ultrasonic signal processor operated at multiple frequencies has the same construction as FIG. 7, except for the presence of switches (15 and 16), input IDTs ($T_{x2}$ and $T_{y2}$) with the same construction patterns as input IDT $T_{x1}$, and output IDTs ($R_{x2}$ and $R_{y2}$) with the same construction patterns as output IDT $R_{x1}$. Input IDTs ($T_{x2}$ and $T_{y2}$) and output IDTs ($R_{x2}$ and $R_{y2}$) are formed on nonpiezoelectric plate 1. Piezoelectric substrates ($2_x$, $3_x$, $2_y$ and $3_y$) are mounted on input IDTs ($T_{x1}$ and $T_{x2}$), output IDTs ($R_{x1}$ and $R_{x2}$), input IDTs ($T_{y1}$ and $T_{y2}$), and output IDTs ($R_{y1}$ and $R_{y2}$), respectively, in the same way as FIG. 3, and are not drawn in FIG. 8.

In the ultrasonic signal processor operated at multiple frequencies in FIG. 8, if one of the input electric signals $S_i$ is applied to each of input IDTs ($T_{x1}$ and $T_{x2}$) in turn via switches (14 and 15), a SAW is excited at each of input IDTs ($T_{x1}$ and $T_{x2}$) in piezoelectric substrate $2_x$. The SAW is effectively transmitted to piezoelectric substrate $3_x$, and then transduced to electric signals $E_{xj}$ at each of output IDTs ($R_{x1}$ and $R_{x2}$). Thus, the SAW propagation lanes $W_{xj}$ are formed between input IDT $T_{x1}$ and output IDT $R_{x1}$, or between input IDT $T_{x2}$ and output IDT $R_{x2}$. In the same way, if one of the input electric signals $S_i$ is applied to each of input IDTs ($T_{y1}$ and $T_{y2}$) in turn via switches (14 and 16), a SAW is excited at each of input IDTs ($T_{y1}$ and $T_{y2}$) in piezoelectric substrate $2_y$. The SAW is effectively transmitted to piezoelectric substrate $3_y$, and transduced to the electric signals $E_{yj}$ at each of output IDTs ($R_{y1}$ and $R_{y2}$). Thus, the SAW propagation lanes $W_{yj}$ are formed between input IDT $T_{y1}$ and output IDT $R_{y1}$, or between input IDT $T_{y2}$ and output IDT $R_{y2}$.

If touching a position on one of the SAW propagation lanes $W_{xj}$ between, for example, input IDT $T_{x2}$ and output IDT $R_{x2}$, and on one of the SAW propagation lanes $W_{yj}$ between, for example, input IDT $T_{y1}$ and output IDT $R_{y1}$ in FIG. 8, one of the electric signals $E_{xj}$ or one of the electric signals $E_{yj}$ is detected at output IDT ($R_{x2}$ or $R_{y1}$), respectively. In this time, the one of the electric signals $E_{xj}$ is detected at output IDT $R_{x2}$ only when input IDT $T_{x2}$ is connected with amplifier 13 via switches (14 and 15), and the one of the electric signals $E_{yj}$ is detected at output IDT $R_{y1}$ only when input IDT $T_{y1}$ is connected with amplifier 13 via switches (14 and 16). The one of the electric signals $E_{xj}$ or the one of the electric signals $E_{yj}$ is applied to coding IDT 5, so that a SAW based on the coded pattern is excited on third piezoelectric substrate 4, and then it is detected as a coded burst-signal at terminal IDT 6. The coded burst signal arrives at initial IDT 8 via switch 10, so that a SAW is excited on fourth piezoelectric substrate 7. In this time, if the SAW on fourth piezoelectric substrate 7 correlates to the coded pattern, a pulse is detected at decoding IDT 9. The pulse arrives at signal analyzer 12 via switch 11. As a result, the one of the SAW propagation lanes $W_{xj}$ or the one of the SAW propagation lanes $W_{yj}$ is sensed by means of the phase of the pulse. In this time, it should be noticed that which of input IDTs ($T_{x1}$, $T_{x2}$, $T_{y1}$ and $T_{y2}$) receives the one of the input electric signals $S_i$ when the pulse appears at signal analyzer 12. For example, if input IDT $T_{x2}$ receives the one of the input electric signals $S_i$, the one of the SAW propagation lanes $W_{xj}$ between input IDT $T_{x2}$ and output IDT $R_{x2}$ is defined. Thus, the touch position on the one of the SAW propagation lanes $W_{xj}$ and on the one of the SAW propagation lanes $W_{yj}$ is recognized.

Figure 9:
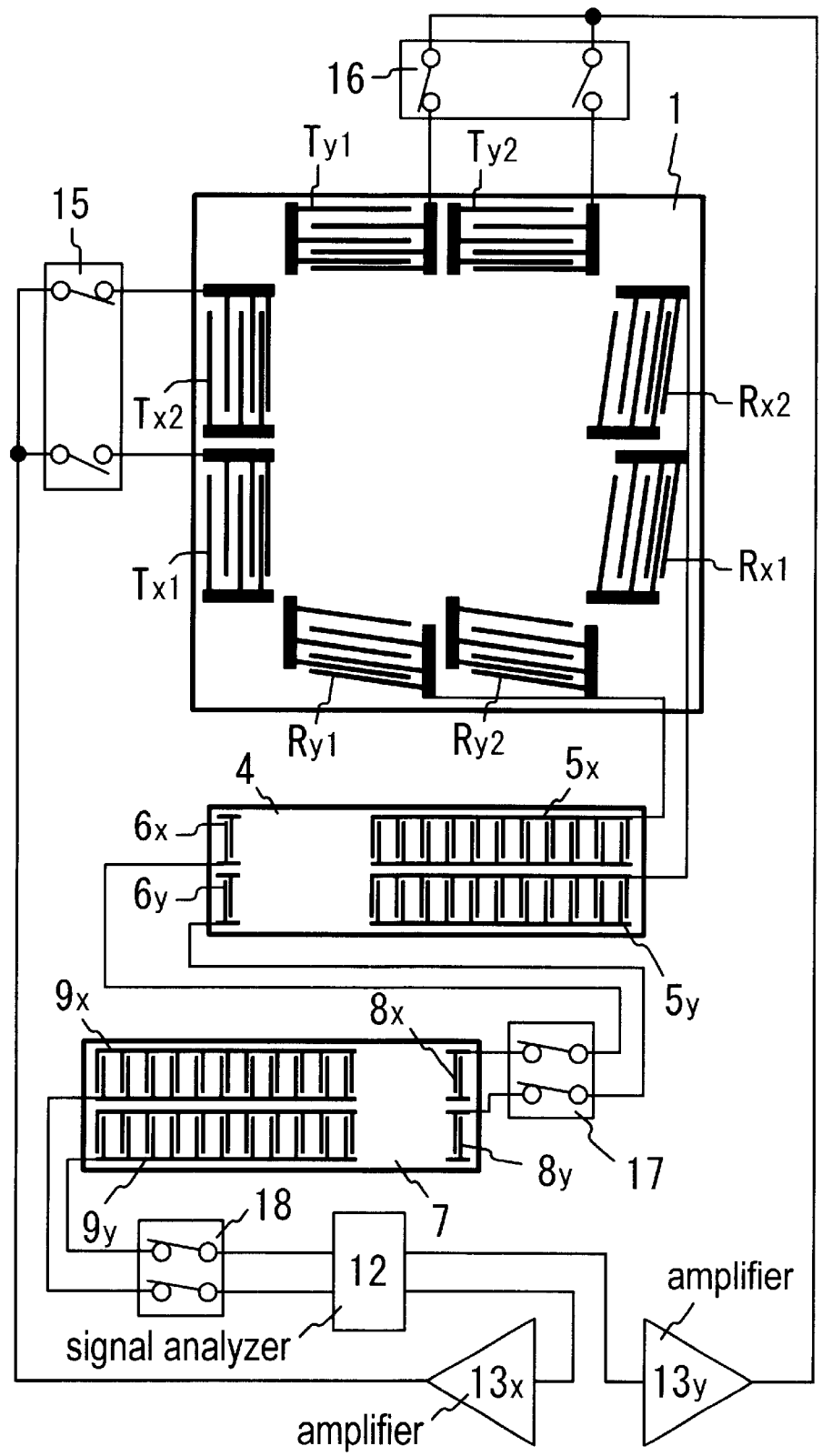
FIG. 9 shows a schematic illustration of an ultrasonic signal processor operated at multiple frequencies according to a fifth embodiment of the present invention.

FIG. 9 shows a schematic illustration of an ultrasonic signal processor operated at multiple frequencies according to a fifth embodiment of the present invention. The ultrasonic signal processor operated at multiple frequencies has the same construction as FIG. 8, except for the presence of switches (17 and 18) in place of switches (10 and 11), respectively, coding IDTs ($5_x$ and $5_y$) in place of coding IDT 5, terminal IDTs ($6_x$ and $6_y$) in place of terminal IDT 6, initial IDTs ($8_x$ and $8_y$) in place of initial IDT 8, and decoding IDTs ($9_x$ and $9_y$) in place of decoding IDT 9, amplifiers ($13_x$ and $13_y$) in place of amplifier 13, and the absence of switch 14. Coding IDT $5_x$ and decoding IDT $9_x$ have the same construction patterns each other. In the same way, coding IDT $5_y$ and decoding IDT $9_y$ have the same construction patterns each other. Piezoelectric substrates ($2_x$, $3_x$, $2_y$ and $3_y$) are not drawn in FIG. 9.

In the ultrasonic signal processor operated at multiple frequencies in FIG. 9, if one of the input electric signals $S_i$ is applied to each of input IDTs ($T_{x1}$ and $T_{x2}$) in turn via switch 15, a SAW is excited at each of input IDTs ($T_{x1}$ and $T_{x2}$) in piezoelectric substrate $2_x$. The SAW is effectively transmitted to piezoelectric substrate $3_x$, and then transduced to electric signals $E_{xj}$ at each of output IDTs ($R_{x1}$ and $R_{x2}$). In the same time, if one of the input electric signals $S_i$ is applied to each of input IDTs ($T_{y1}$ and $T_{y2}$) in turn via switch 16, a SAW is excited at each of input IDTs ($T_{y1}$ and $T_{y2}$) in piezoelectric substrate $2_y$. The SAW is effectively transmitted to piezoelectric substrate $3_y$, and transduced to the electric signals $E_{yj}$ at each of output IDTs ($R_{y1}$ and $R_{y2}$). Thus, the SAW propagation lanes $W_{xj}$ are formed between input IDT $T_{x1}$ and output IDT $R_{x1}$, or between input IDT $T_{x2}$ and output IDT $R_{x2}$, and at the same time, the SAW propagation lanes $W_{yj}$ are formed between input IDT $T_{y1}$ and output IDT $R_{y1}$, or between input IDT $T_{y2}$ and output IDT $R_{y2}$.

If touching a position on one of the SAW propagation lanes $W_{xj}$ between, for example, input IDT $T_{x2}$ and output IDT $R_{x2}$, and on one of the SAW propagation lanes $W_{yj}$ between, for example, input IDT $T_{y1}$ and output IDT $R_{y1}$ in FIG. 9, one of the electric signals $E_{xj}$ and one of the electric signals $E_{yj}$ are simultaneously detected at output IDTs ($R_{x2}$ and $R_{y1}$), respectively. In this time, the one of the electric signals $E_{xj}$ is detected at output IDT $R_{x2}$ only when input IDT $T_{x2}$ is connected with amplifier $13_x$ via switch 15, and the one of the electric signals $E_{yj}$ is detected at output IDT $R_{y1}$ only when input IDT $T_{y1}$ is connected with amplifier $13_y$ via switch 16. The one of the electric signals $E_{xj}$ and the one of the electric signals $E_{yj}$ are applied to coding IDTs ($5_x$ and $5_y$), so that SAWs based on the coded patterns of coding IDTs ($5_x$ and $5_y$), respectively, are excited on third piezoelectric substrate 4, and then they are detected as coded burst-signals at terminal IDTs ($6_x$ and $6_y$), respectively. The coded burst signals arrive at initial IDTs ($8_x$ and $8_y$), respectively, via switch 17, so that SAWs are excited on fourth piezoelectric substrate 7. In this time, if the SAWs on fourth piezoelectric substrate 7 correlates to the coded patterns, respectively, pulses are detected at decoding IDTs ($9_x$ and $9_y$). The pulses arrive at signal analyzer 12 via switch 18. As a result, the one of the SAW propagation lanes $W_{xj}$ and the one of the SAW propagation lanes $W_{yj}$ are sensed by means of the phases of the pulses. Thus, the touch position is recognized. Furthermore, using coding IDTs ($5_x$ and $5_y$) with the different coded patterns from each other keeps a still further security.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. An ultrasonic signal processor operated at multiple frequencies comprising:
   a nonpiezoelectric plate;
   an input IDT with a dispersive type of electrode-finger pattern, and having an overlap length L and interdigital periodicities $P_i$ (i=1, 2, ..., m);
   an output IDT with a dispersive-slant type of electrode-finger pattern, and having the electrode-finger direction slanting to that of said input IDT by an angle θ, and also having an overlap length $L_P$ along said electrode-finger direction of said output IDT and interdigital periodicities $Q_i$ (i=1, 2, ..., m) along the orthogonal direction to said electrode-finger direction of said output IDT;
   a first piezoelectric substrate; and
   a second piezoelectric substrate,
      said input- and output IDTs, and said first- and second piezoelectric substrates forming a transducer-unit,
      said input IDT receiving one of input electric signals $S_i$ (i=1, 2, ..., m) with frequencies $f_i$ (i=1, 2, ..., m) corresponding to said interdigital periodicities $P_i$, respectively, exciting a SAW in said first piezoelectric substrate, and transmitting said SAW to said second piezoelectric substrate along an upper end surface of said nonpiezoelectric plate,
   said output IDT transducing said SAW to electric signals $E_j$ (j=1, 2, ..., n), of which the phase delays linearly correlate to SAW propagation lanes $W_j$ (j=1, 2, ..., n) between said input- and output IDTs on said upper end surface of said nonpiezoelectric plate.

2. An ultrasonic signal processor operated at multiple frequencies as defined in claim 1, wherein each of said interdigital periodicities $Q_i$ is equal to the product of the corresponding one of said interdigital periodicities $P_i$ and cos θ, and said overlap length $L_P$ is equal to the product of said overlap length L and sec θ.

3. An ultrasonic signal processor operated at multiple frequencies as defined in claim 1 further comprising:
   a third piezoelectric substrate;
   a coding IDT consisting of electrode-finger pairs, of which two neighbors are at a distance from each other, and having a coded pattern, said distance equaling one of said interdigital periodicities $P_i$;
   a terminal IDT having the electrode-finger direction parallel to that of said coding IDT;
   a fourth piezoelectric substrate;
   an initial IDT;
   a decoding IDT having the same construction pattern as said coding IDT; and
   a signal analyzer,
      said coding IDT receiving one of said electric signals $E_j$ only when touching one of said SAW propagation lanes $W_j$, and exciting a SAW based on said coded pattern on said third piezoelectric substrate,
      said terminal IDT detecting a coded burst-signal corresponding to said coded pattern,
      said initial IDT receiving said coded burst-signal, and exciting a SAW on said fourth piezoelectric substrate,
      said decoding IDT detecting a pulse if said SAW on said fourth piezoelectric substrate correlates to said coded pattern, and
      said signal analyzer sensing said one of said SAW propagation lanes $W_j$ by means of the phase of said pulse.

4. An ultrasonic signal processor operated at multiple frequencies as defined in claim 1, wherein said first- and second piezoelectric substrates are made of a piezoelectric ceramic, respectively, the polarization axis thereof being parallel to the thickness direction thereof.

5. An ultrasonic signal processor operated at multiple frequencies as defined in claim 1, wherein said first- and second piezoelectric substrates have a thickness smaller than the smallest one of said interdigital periodicities $P_i$, and said nonpiezoelectric plate has a thickness larger than three times the largest one of said interdigital periodicities $P_i$.

6. An ultrasonic signal processor operated at multiple frequencies as defined in claim 1, wherein the phase velocity of said SAW on said nonpiezoelectric plate alone is higher than that in said first- and second piezoelectric substrates alone.

7. An ultrasonic signal processor operated at multiple frequencies comprising:
   a nonpiezoelectric plate; and
   two transducer-units, of which each consists of
      at least one input IDT with a dispersive type of electrode-finger pattern, and having an overlap length L and interdigital periodicities $P_i$ (i=1, 2, ..., m),
      at least one output IDT with a dispersive-slant type of electrode-finger pattern, and having the electrode-finger direction slanting to that of said input IDT by an angle θ, and also having an overlap length $L_P$ along said electrode-finger direction of said output IDT and interdigital periodicities $Q_i$ (i=1, 2, ..., m) along the orthogonal direction to said electrode-finger direction of said output IDT,
      a first piezoelectric substrate, and
      a second piezoelectric substrate,
         said at least one input IDT receiving one of input electric signals $S_i$ (i=1, 2, ..., m) with frequencies $f_i$ (i=1, 2, ..., m) corresponding to said interdigital periodicities $P_i$, respectively, exciting a SAW in said first piezoelectric substrate, and transmitting said SAW to said second piezoelectric substrate along an upper end surface of said nonpiezoelectric plate, said at least one output IDT transducing said SAW to electric signals $E_j$ (j=1, 2, ..., n), of which the phase delays linearly correlate to SAW propagation lanes $W_j$ (j=1, 2, ..., n) between said at least one input IDT and said at least one output IDT on said upper end surface of said nonpiezoelectric plate.

8. An ultrasonic signal processor operated at multiple frequencies as defined in claim 7, wherein each of said interdigital periodicities $Q_i$ is equal to the product of the corresponding one of said interdigital periodicities $P_i$ and cos θ, and said overlap length $L_P$ is equal to the product of said overlap length L and sec θ.

9. An ultrasonic signal processor operated at multiple frequencies as defined in claim 7 further comprising:

a third piezoelectric substrate;

a coding IDT consisting of electrode-finger pairs, of which two neighbors are at a distance from each other, and having a coded pattern, said distance equaling one of said interdigital periodicities $P_i$;

a terminal IDT having the electrode-finger direction parallel to that of said coding IDT;

a fourth piezoelectric substrate;

an initial IDT;

a decoding IDT having the same construction pattern as said coding IDT; and a signal analyzer, said coding IDT receiving one of said electric signals $E_j$ only when touching one of said SAW propagation lanes $W_j$, and exciting a SAW based on said coded pattern on said third piezoelectric substrate, said terminal IDT detecting a coded burst-signal corresponding to said coded pattern, said initial IDT receiving said coded burst-signal, and exciting a SAW on said fourth piezoelectric substrate, said decoding IDT detecting a pulse if said SAW on said fourth piezoelectric substrate correlates to said coded pattern, and said signal analyzer sensing said one of said SAW propagation lanes $W_j$ by means of the phase of said pulse.

10. An ultrasonic signal processor operated at multiple frequencies as defined in claim 7, wherein said first- and second piezoelectric substrates are made of a piezoelectric ceramic, respectively, the polarization axis thereof being parallel to the thickness direction thereof.

11. An ultrasonic signal processor operated at multiple frequencies as defined in claim 7, wherein said first- and second piezoelectric substrates have a thickness smaller than the smallest one of said interdigital periodicities $P_i$, and said nonpiezoelectric plate has a thickness larger than three times the largest one of said interdigital periodicities $P_i$.

12. An ultrasonic signal processor operated at multiple frequencies as defined in claim 7, wherein the phase velocity of said SAW on said nonpiezoelectric plate alone is higher than that in said first- and second piezoelectric substrates alone.

13. An ultrasonic signal processor operated at multiple frequencies comprising:

a nonpiezoelectric plate;

two ultrasonic units, of which each consists of at least one input IDT with a dispersive type of electrode-finger pattern, and having an overlap length L and interdigital periodicities $P_i$ (i=1, 2, ..., m), at least one output IDT with a dispersive-slant type of electrode-finger pattern, and having the electrode-finger direction slanting to that of said input IDT by an angle θ, and also having an overlap length $L_P$ along said electrode-finger direction of said output IDT and interdigital periodicities $Q_i$ (i=1, 2, ..., m) along the orthogonal direction to said electrode-finger direction of said output IDT, a first piezoelectric substrate, a second piezoelectric substrate, a boding IDT consisting of electrode-finger pairs, of which two neighbors are at a distance from each other, and having a coded pattern, said distance equaling one of said interdigital periodicities $P_i$, a terminal IDT having the electrode-finger direction parallel to that of said coding IDT, an initial IDT, a decoding IDT having the same construction pattern as said coding IDT;

a third piezoelectric substrate;

a fourth piezoelectric substrate; and a signal analyzer, said at least one input IDT receiving one of input electric signals $S_i$ (i=1, 2, ..., m) with frequencies $f_i$ (i=1, 2, ..., m) corresponding to said interdigital periodicities $P_i$, respectively, exciting a SAW in said first piezoelectric substrate, and transmitting said SAW to said second piezoelectric substrate along an upper end surface of said nonpiezoelectric plate, said at least one output IDT transducing said SAW to electric signals $E_j$ (j=1, 2, ..., n), of which the phase delays linearly correlate to SAW propagation lanes $W_j$ (j=1, 2, ..., n) between said at least one input IDT and said at least one output IDT on said upper end surface of said nonpiezoelectric plate, said coding IDT receiving one of said electric signals $E_j$ only when touching one of said SAW propagation lanes $W_j$, and exciting a SAW based on said coded pattern on said third piezoelectric substrate, said terminal IDT detecting a coded burst-signal corresponding to said coded pattern, said initial IDT receiving said coded burst-signal, and exciting a SAW on said fourth piezoelectric substrate, said decoding IDT detecting a pulse if said SAW on said fourth piezoelectric substrate correlates to said coded pattern, and said signal analyzer sensing said one of said SAW propagation lanes $W_j$ by means of the phase of said pulse.

14. An ultrasonic signal processor operated at multiple frequencies as defined in claim 13, wherein said coding IDT of one of said two ultrasonic units and that of the other of said two ultrasonic units have the different coded patterns from each other.

15. An ultrasonic signal processor operated at multiple frequencies as defined in claim 13, wherein said first- and second piezoelectric substrates are made of a piezoelectric ceramic, respectively, the polarization axis thereof being parallel to the thickness direction thereof.

16. An ultrasonic signal processor operated at multiple frequencies as defined in claim 13, wherein said first- and second piezoelectric substrates have a thickness smaller than the smallest one of said interdigital periodicities $P_i$, and said nonpiezoelectric plate has a thickness larger than three times the largest one of said interdigital periodicities $P_i$.

17. An ultrasonic signal processor operated at multiple frequencies as defined in claim 13, wherein the phase velocity of said SAW on said nonpiezoelectric plate alone is higher than that in said first- and second piezoelectric substrates alone.

* * * * *